United States Patent
Kronmueller et al.

(10) Patent No.: US 10,963,032 B2
(45) Date of Patent: Mar. 30, 2021

(54) POWER SUPPLY WITH POWER DELIVERY NETWORK EQUALIZATION

(71) Applicant: Dialog Semiconductor (UK) Limited, London (GB)

(72) Inventors: Frank Kronmueller, Neudenau (DE); Mark Childs, Swindon (GB); Ahmed Shaban, Kirchheim unter teck (DE)

(73) Assignee: Dialog Semiconductor (UK) Limited, London (GB)

( * ) Notice: Subject to any disclaimer, the term of this patent is extended or adjusted under 35 U.S.C. 154(b) by 1 day.

(21) Appl. No.: 16/371,561

(22) Filed: Apr. 1, 2019

(65) Prior Publication Data

US 2019/0384372 A1 Dec. 19, 2019

(30) Foreign Application Priority Data

Jun. 15, 2018 (DE) .......................... 102018209676.7

(51) Int. Cl.
| | | |
|---|---|---|
| *G06F 1/3209* | (2019.01) | |
| *H02J 3/14* | (2006.01) | |
| *G05F 1/575* | (2006.01) | |
| *G06F 1/26* | (2006.01) | |
| *G05F 1/565* | (2006.01) | |
| *H02M 1/14* | (2006.01) | |
| *H02M 3/158* | (2006.01) | |
| *G05F 1/62* | (2006.01) | |

(52) U.S. Cl.
CPC ............ *G06F 1/3209* (2013.01); *G05F 1/565* (2013.01); *G05F 1/575* (2013.01); *G05F 1/62* (2013.01);
(Continued)

(58) Field of Classification Search
CPC ... G05F 1/56; G05F 1/575; G05F 1/62; G05F 1/565; G06F 1/26; H02M 1/143;
(Continued)

(56) References Cited

U.S. PATENT DOCUMENTS

| | | | |
|---|---|---|---|
| 5,774,021 A | 6/1998 | Szepesi | |
| 7,759,912 B2 * | 7/2010 | Weng | H02M 3/156 |
| | | | 323/222 |
| 10,534,384 B2 * | 1/2020 | Manlove | G05F 1/562 |

FOREIGN PATENT DOCUMENTS

DE 69728157 8/2004

OTHER PUBLICATIONS

German Office Action, File No.: 10 2018 209 676.7, Appliant: Dialog Semiconductor (UK) Limited, dated Feb. 10, 2020, 8 pages.

(Continued)

*Primary Examiner* — Ryan Johnson
(74) *Attorney, Agent, or Firm* — Sails Ackerman LLC; Stephen B. Ackerman

(57) ABSTRACT

A power supply and a method to provide power to a load via a power delivery network are presented. The power delivery network adds a pole and/or zero to a transfer function of the power supply. The power supply has a feedback unit to sense a load voltage at the load and to provide a feedback voltage which is indicative of the load voltage. The power supply has an input amplifier provides an error voltage based on the feedback voltage. The power supply has a power converter to provide power to the power delivery network depending on the error voltage. The power supply has an equalization unit to add a zero and/or a pole to the transfer function of the power supply, such that the pole and/or zero of the power delivery network is partially compensated. The equalization unit is located between an input amplifier and a power converter.

13 Claims, 10 Drawing Sheets

(52) U.S. Cl.
CPC ............... *G06F 1/26* (2013.01); *H02J 3/14* (2013.01); *H02M 1/143* (2013.01); *H02M 3/158* (2013.01)

(58) Field of Classification Search
CPC ........ H02M 1/14; H02M 3/156; H02M 3/158; H02M 3/1582
See application file for complete search history.

(56) References Cited

OTHER PUBLICATIONS

Hangseok Choi, Ph.D: Practical Feedback Loop Design Considerations for Switched Mode Power Supplies. In: Fairchild Semiconductor. San José, USA: Fairchild Semiconductor Power Seminar. 2010-2011.—company publication, pp. 1-14.

Robert W. Erickson, Dragan Maksimovic: Fundamentals of Power Electronics. In: Springer-Verlag, 2001, chapter 9.—ISSN ISBN 978-0-7923-7270-7, pp. 1-43.

B. Calvo, S. Celma, M. T. Sanz: A Linear CMOS Gm-C-OTA Biquad Filter with 10-100 MHz Tuning. In: 47th IEEE International Midwest Symposium on Circuits and Systems, 2004, pp. 61-64. (D3).

Andreas Gerlach, Moritz Junge, Jürgen Scheible, Thoralf Rosahl: Optimierte, wiederverwendbare OTA-Schaltungen für moderne Power BiCMOS-Technologien. In: Robert Bosch Zentrum für Leistungselektronik, MPC-Workshop, Jul. 2014, pp. 21-26. (D4) Please note: Document D4 is in the German language and is used in the office action only in the following sentence: "Documents D3 and D4 show compensation circuits based on an OTA.".

\* cited by examiner

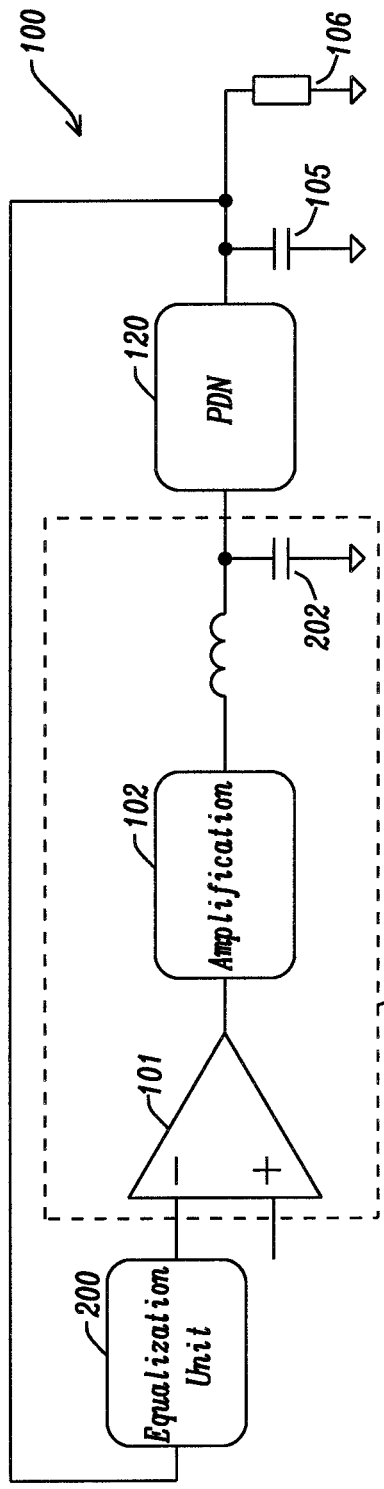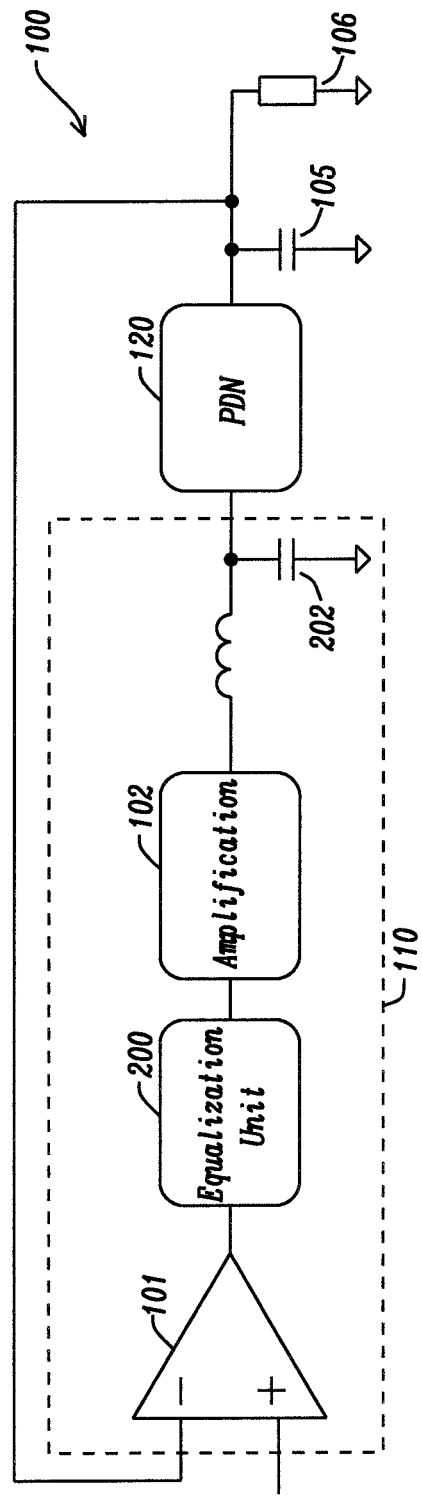

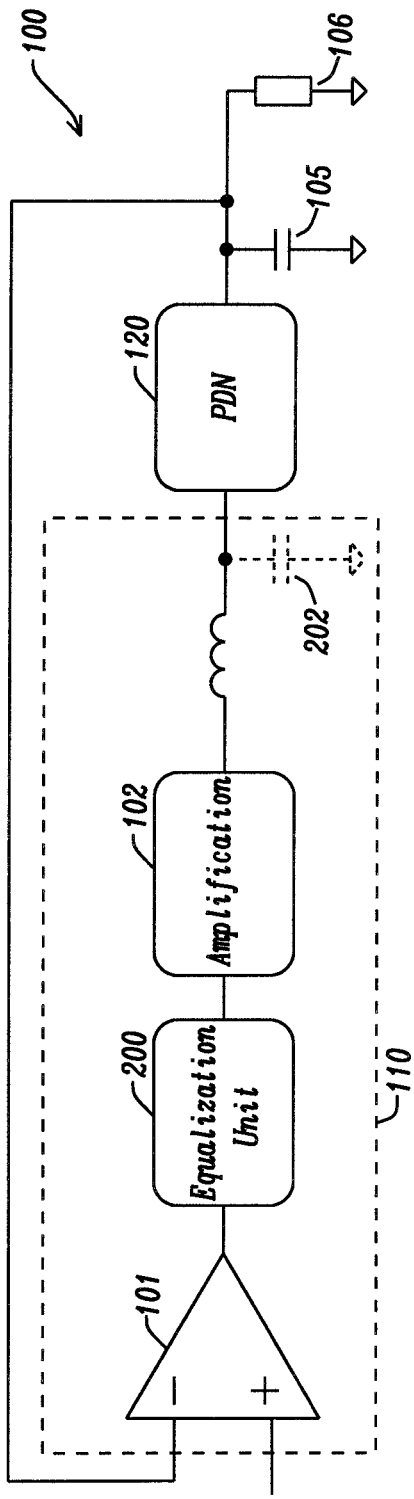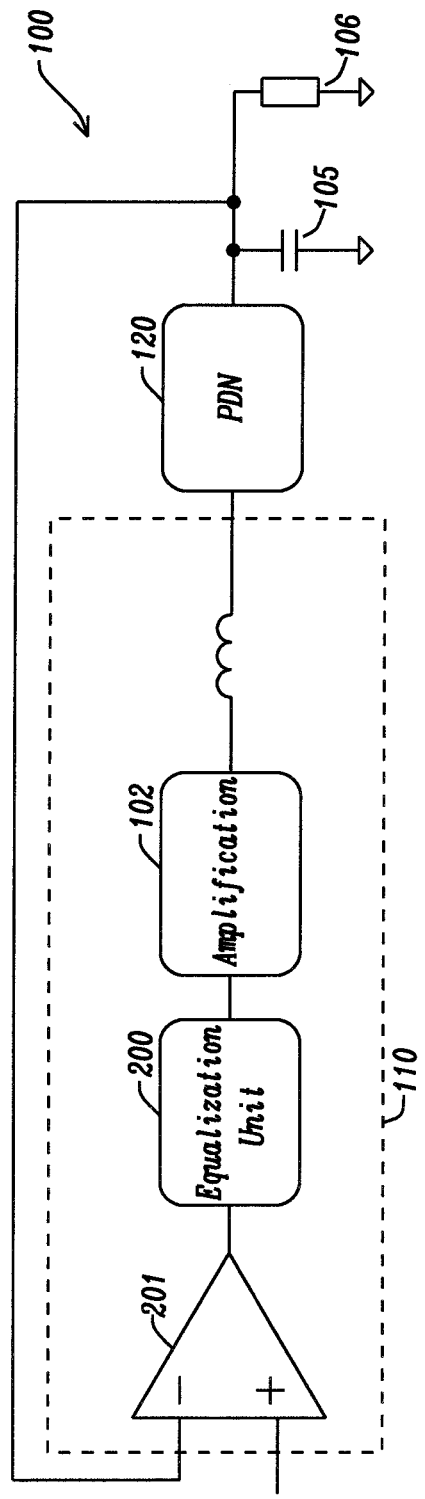

POWER SUPPLY WITH POWER DELIVERY NETWORK EQUALIZATION

TECHNICAL FIELD

The present document relates to power supplies, notably to regulated power supplies. In particular, the present document relates to the compensation of the effects of a power delivery network on a power supply.

BACKGROUND

Power supplies which comprise power converters, such as buck converters, are typically coupled to a load via a power delivery network. The power delivery network (PDN) exhibits a transfer function which may impact the stability of the power supply, notably at relatively high frequencies.

SUMMARY

The present document addresses the technical problem of providing a cost and space efficient power supply which exhibits an increased bandwidth.

According to an aspect, a power supply configured to provide power to a load via a power delivery network is described. The power delivery network is configured to add a pole and/or zero to a transfer function of the power supply. The power supply comprises a feedback unit configured to sense a load voltage at the load and to provide a feedback voltage which is indicative of the load voltage. Furthermore, the power supply comprises an input amplifier configured to provide an error voltage based on the feedback voltage. In addition, the power supply comprises a power converter configured to provide power to the power delivery network in dependence of the error voltage. Furthermore, the power converter comprises an equalization unit configured to add a zero and/or a pole to the transfer function of the power supply, such that the pole and/or zero of the power delivery network is at least partially compensated.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein

FIGS. 2A to 2E shows example power supplies comprising an equalization unit;

DESCRIPTION

Figure 1A:
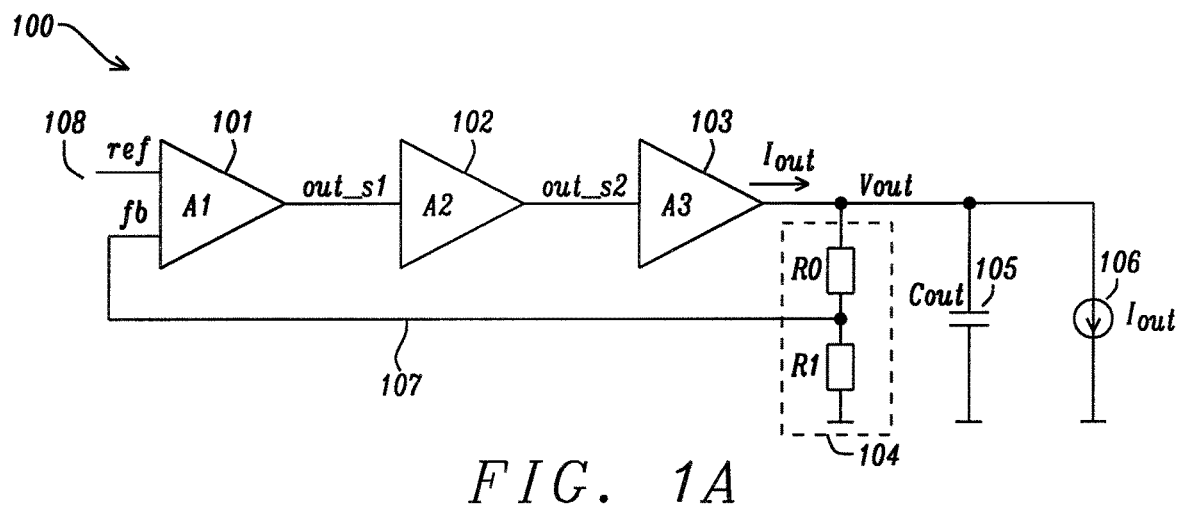
FIG. 1A illustrates an example block diagram of an LDO regulator as an example for a power supply.

As indicated above, the present document is directed at the technical problem of increasing the bandwidth of a (regulated) power supply. In this context, FIG. 1A illustrates a LDO regulator 100 as an example for a regulated power supply. The LDO regulator 100 comprises an output amplification stage or output stage 103, comprising e.g. a field-effect transistor (FET), at the output and a differential or first amplification stage 101 (also referred to as error amplifier) at the input. A first input (fb) 107 of the differential or input amplification stage 101 receives a fraction of the load voltage VOUT determined by the voltage divider 104 comprising resistors R0 and R1. The second input (ref) to the differential amplification stage 101 is a stable voltage reference Vref 108 (also referred to as the bandgap reference). If the load voltage VOUT changes relative to the reference voltage Vref (or to a setpoint voltage proportional to the reference voltage), the drive voltage to the output amplification stage, e.g. to the power FET, changes by a feedback mechanism called main feedback loop to maintain a constant load voltage VOUT.

The LDO regulator 100 of FIG. 1A further comprises an additional intermediate amplification stage 102 configured to amplify the differential or error output voltage of the differential amplification stage 101. An intermediate amplification stage 102 may be used to provide an additional gain within the amplification path. Furthermore, the intermediate amplification stage 102 may provide a phase inversion.

In addition, the LDO regulator 100 is typically used in conjunction with a load capacitance Cout (also referred to as output capacitor or stabilization capacitor) 105 parallel to the load 106. The load capacitor 105 is used to stabilize the load voltage VOUT subject to a change of the load 106, in particular subject to a change of the requested load current or output current Iload/IOUT.

Figure 1B:
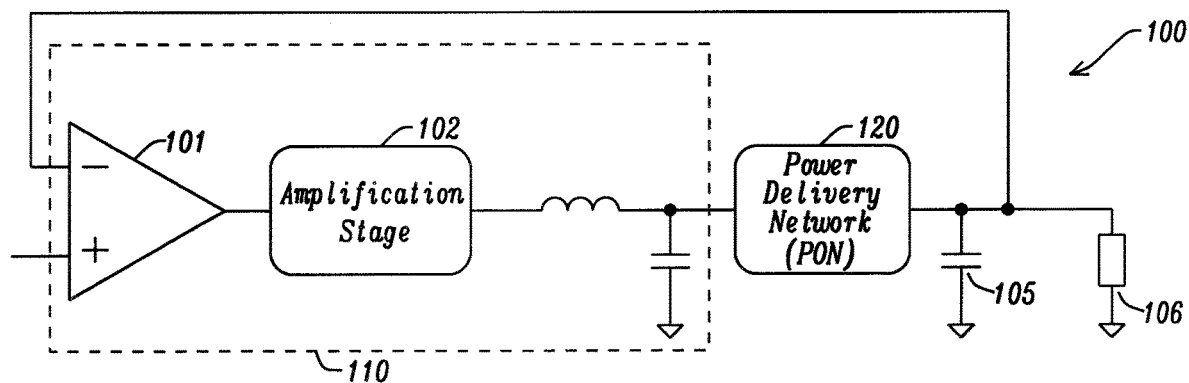
FIG. 1B illustrates an example block diagram of a regulated power supply comprising a switched power converter.
Figure 1C:
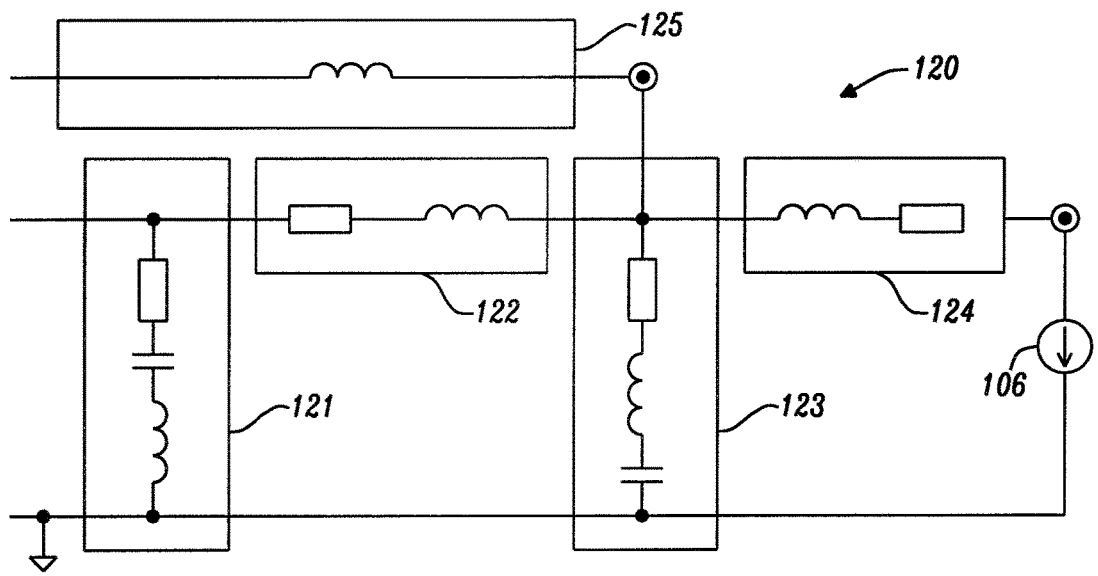
FIG. 1C shows example parasitic elements of a power delivery network.

FIG. 1B shows an example regulated power supply 100 which comprises a switched power converter 110. Furthermore, a power delivery network (PDN) 120 is illustrated, wherein the PDN 120 is configured to transfer power which is provided by the power converter 110 to the load 106. FIG. 1C illustrates example parasitic elements of a PDN 120, such as elements of the capacitor 121 of the power converter 110, elements of the printed circuit board (PCB) 122, elements of the load capacitor 123, elements of the package 126 of the power supply 100 and elements of the feedback 125 of the regulator 100.

Figure 1D:
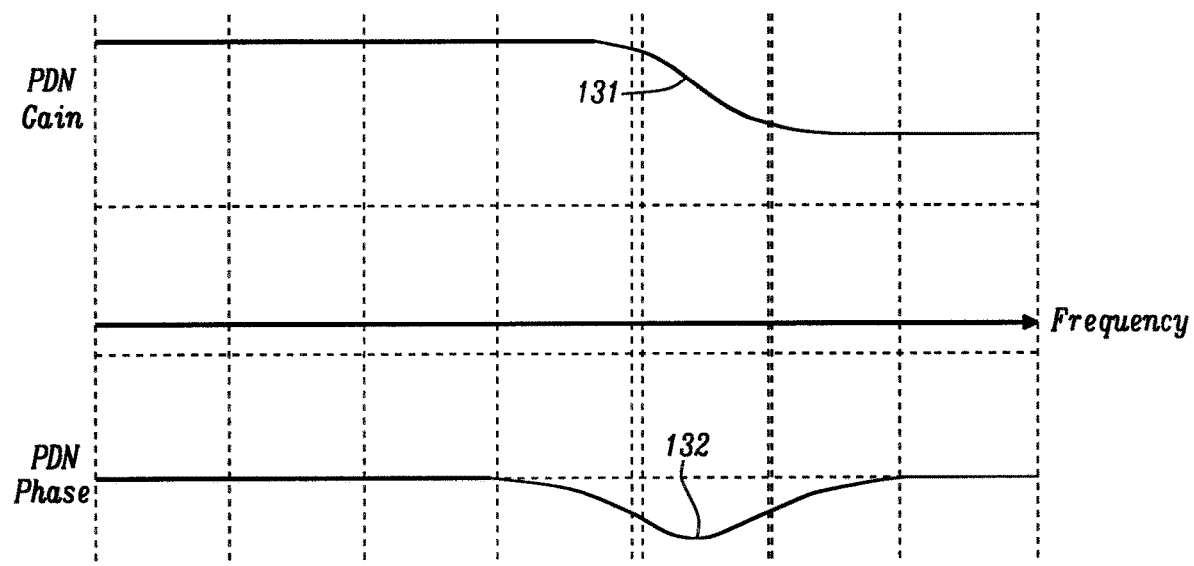
FIG. 1D shows an example transfer function of a power delivery network.

The parasitic elements of a PDN 120 affect the transfer function and the stability of the regulated power supply 100, notably at relatively high frequencies. FIG. 1D shows the gain 131 and the phase 132 of the transfer function of the PDN 120, as a function of frequency. It can be seen that the PDN 120 exhibits a pole which impacts the stability of the regulated power supply 100, notably at relatively high frequencies (e.g. in the range of 1 MHz).

A possibility to address the effects of the PDN 120 is to set the feedback point of the feedback loop directly to the output of the power converter 110. As a result of this, phase adverse effects of the PDN 120 on loop stability may be avoided. However, a voltage drop across the PDN 120 cannot be taken into account by the regulation loop, which impacts the precision of the regulated power supply 100, notably for relatively large currents.

A further option is to move the feedback point closer to the load 106 (ideally directly at the load), in order to compensate the voltage drop of the PDN 120. In this case, the phase shift caused by the internal pole of the PDN 120 may impact the total loop stability, when the GBW (Gain Bandwidth) is set relatively close to the pole of the PDN 120. This may be the case in cases where the overall system GBW needs to be reduced in order to provide a stable system.

The present document is directed at cancelling the PDN phase effect, in order to be able to extend the total system bandwidth into the frequency region of the pole of the PDN 120, when using point-of-load control. For this purpose, an equalizer unit may be added into the loop of the regulated power supply 100. The equalization may be performed using a circuit which introduces one or more zeros and/one or more poles which closely match the one or more poles and/or the one or more zeros of the PDN 120, in order to provide a flat zero degree phase response. Whether the zero degree phase response is achieved at unity gain or at lower gains depends on the PDN 120. The effect of the gain may typically be cancelled by regulation (and therefore do not need to be taken into account during equalization).

In order to equalize a PDN 120, the one or more compensating zeros and/or poles typically need to be placed at a relatively high frequency. Furthermore, the one or more compensating zeros and/or poles should maintain an ideal behavior over a relatively wide frequency range.

An operational amplifier may be used for equalization. The use of an operational amplifier typically requires a GBW which is at least two decades above the desired frequency of a zero that is to be implemented. Furthermore, such a feedback-based solution typically requires relatively high power. In the present document a current mode forward amplifier is used for equalization, thereby providing a space and power efficient equalization scheme.

Once equalization is achieved, total system bandwidth extension may be achieved by increasing the system DC-gain. This also lowers the output impedance of the converter. Alternatively or in addition, system bandwidth extension may be achieved by reducing the load capacitor and/or the output capacitor of the switched power converter 110, in order to increase the system GBW product. Given typical values, the capacitances are approx. 100 µF at the output of the switched power converter 110 and approx. 50 µF for the load capacitor 105. In view of the fact that these capacitors typically take up considerable PCB area, reducing the number and/or the size of the capacitors provides benefits with regards to the size of a voltage regulator 100.

Figure 2E:
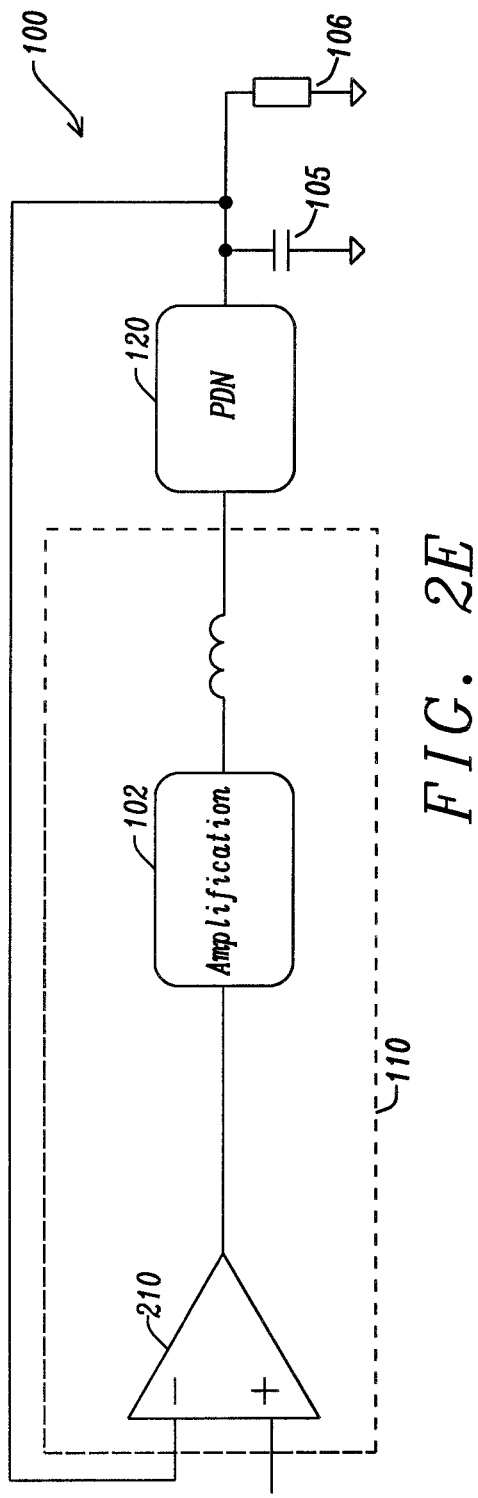

FIG. 2A to 2E shows example regulated power supplies 100 which comprise an equalization unit 200. In the example of FIG. 2A, the equalization unit 200 is positioned between the output of the feedback loop and the input of the differential or input amplifier 101. In the example of FIG. 2B, the equalization unit 200 is positioned between the output of the differential or input amplifier 101 and the input of a power modification unit/intermediate amplification unit 102. FIG. 2C corresponds to the example of FIG. 2B. However, the output capacitor 202 of the switched power converter 110 is reduced or possibly completely reduced, in order to increase the GBW. The error amplifier 101 of FIG. 2B may be replaced by a transconductor- or GM-stage 201, as illustrated in FIG. 2D.

Alternatively or in addition, the equalization unit 200 may be integrated within the error amplifier 101 or gm-stage 201 (generally referred to as input amplifier), thereby enabling a particularly efficient equalization within an equalizing amplifier 210. In particular, a current mode feedforward amplifier may be integrated in the GM-stage 201 itself. This is beneficial, because the structure of the GM-stage 201 typically inherently provides a relative high bandwidth, such that the addition of a feedforward current amplifier may be achieved in an efficient manner.

Figure 5:
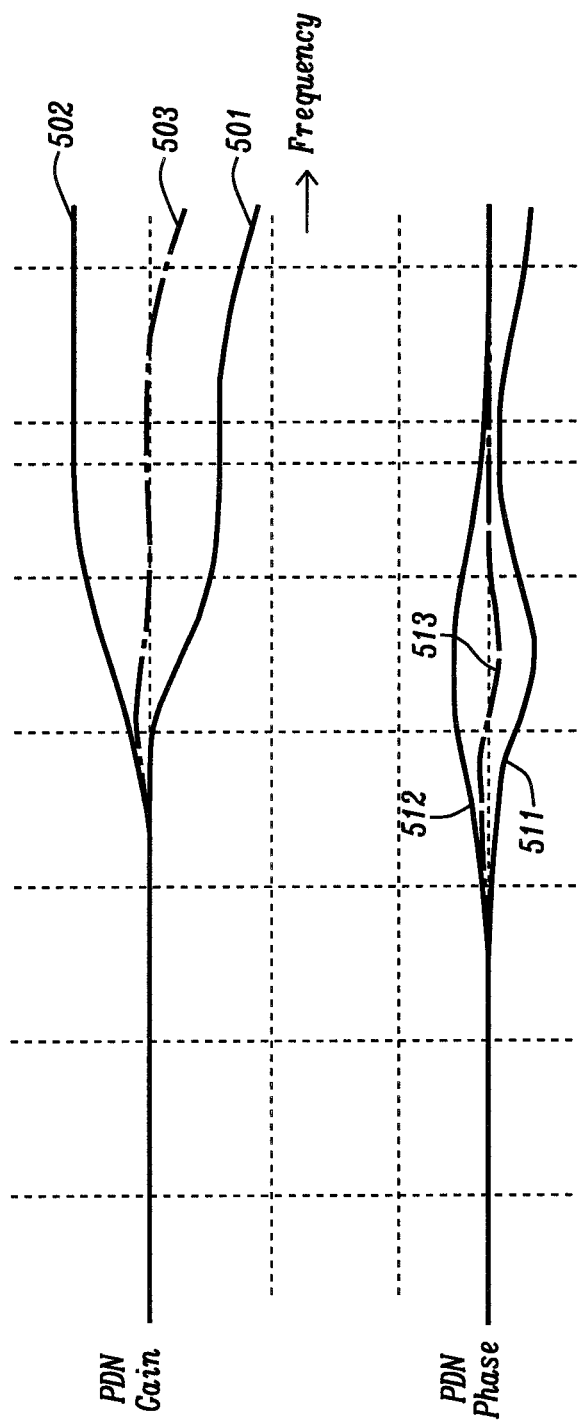
FIG. 5 shows example transfer functions.

Hence, an equalization unit 200 is added to a regulated power supply 100, wherein the equalization unit 200 counters the adverse phase effect of a PDN 120. The combination of the equalization unit 200 and the PDN 120 yields an equalized flat phase transfer function. This can be seen in FIG. 5. In particular, FIG. 5 shows the phase 511 of the transfer function of the PDN 120, the phase 512 of the transfer function of the equalization unit 200, and the resulting phase 513 of the regulated power supply 100. Furthermore, FIG. 5 shows the gain 501 of the transfer function of the PDN 120, the gain 502 of the transfer function of the equalization unit 200, and the resulting gain 503 of the regulated power supply 100. It can be seen that a flat phase can be achieved by making use of an equalization unit 200.

As a result of compensating the one or more poles and/or zeroes of a PDN 120, the system voltage gain of the voltage regulator 100 may be set to an increased GBW. The increased GBW may be achieved by reducing the capacitive load of the voltage regulator 100, thereby reducing PCB board space and the BOM (bill of material). By way of example, 80 µF out of 130 µF may be removed.

Figure 3A:
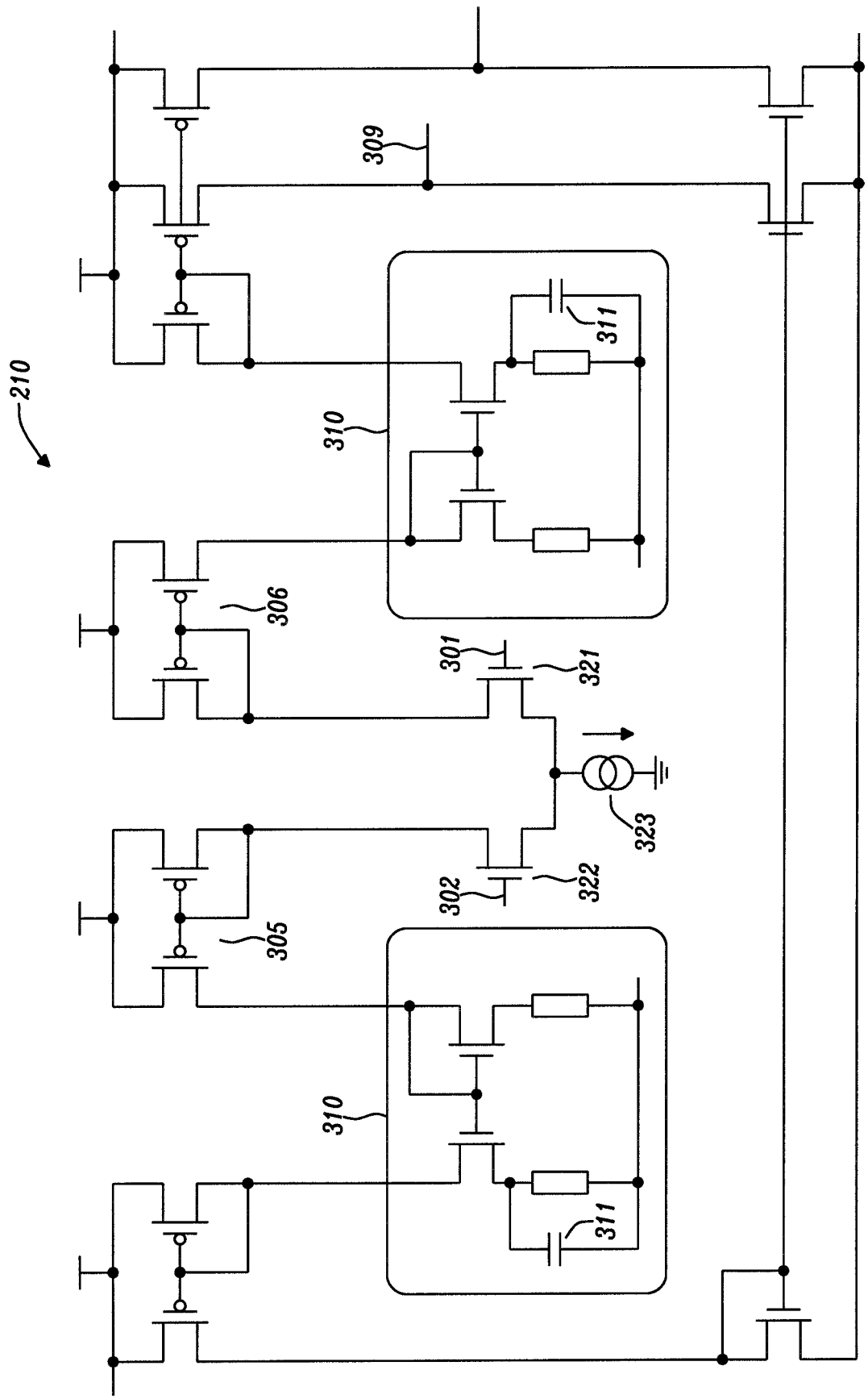
FIGS. 3A to 3C show circuit diagrams of example input amplifiers comprising an equalization unit.

FIG. 3A shows a circuit diagram of an example equalizing amplifier 210. The equalizing amplifier 210 comprises a GM-stage 201 with the current mirrors 305, 306. Furthermore, the equalizing amplifier 210 comprise current mode amplifiers 310.

In other words, a GM-stage 201 may be used to provide a power efficient current-mode switching power supply. A GM-stage 201 typically exhibits substantially ideal frequency behavior beyond switching frequency, such that the components of the GM-stage 201 are typically suited for increased frequency operation. Furthermore, one or more current mode feedforward amplifiers (CMFF amplifiers) 310 may be added to provide a high frequency zero for compensating the PDN effect. Hence, adding a current mode amplifier 310 within a GM-stage 201 is a particularly cost efficient approach for providing equalization of the PDN effects.

The equalizing amplifier 210 of FIG. 3A comprises input transistors 321, 322 which are controlled by the first input 301 and the second input 302 of the amplifier 210, respectively. The current through the input transistors 321, 322 is provided by a current source 323 and is mirrored to the equalization stages 310 (i.e. to the current mode amplifiers) using respective current mirrors 305, 306. The zero of the equalization stages 310 may be tuned using the capacitor 311 of the equalization stages 310. The currents at the outputs of the equalization stages 310 are mirrored to a joint output 309 of the amplifier 210, thereby providing a differential and/or error voltage at the output 309 of the amplifier 210.

Figure 3B:
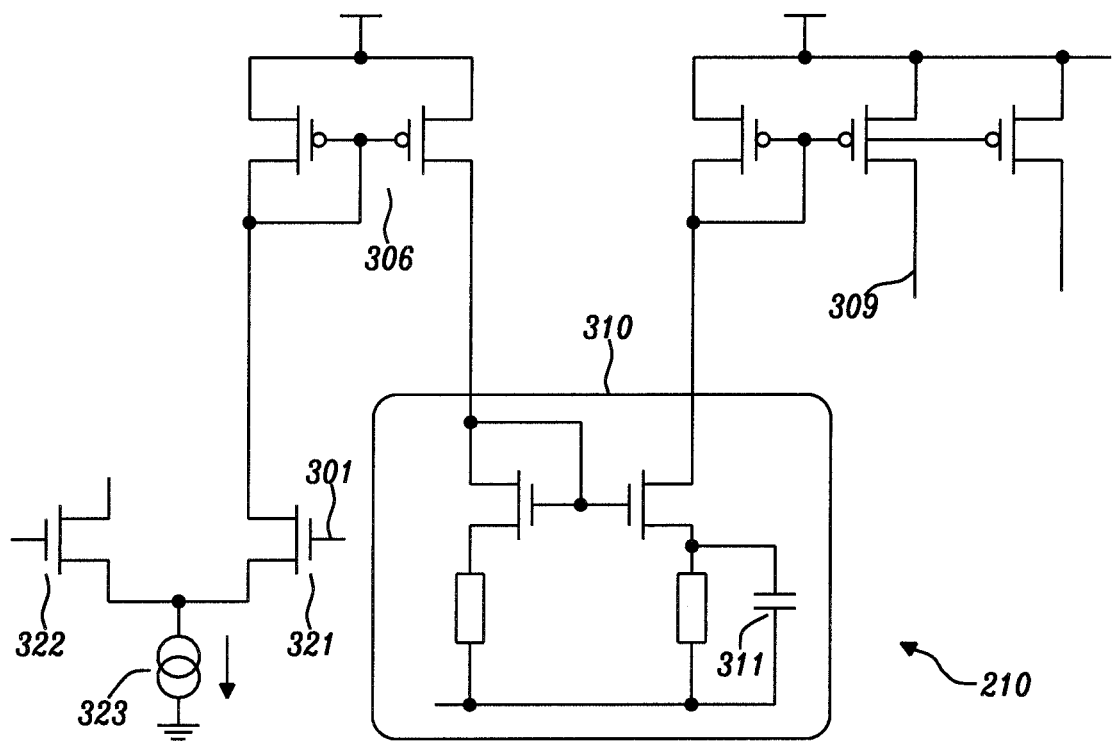
Figure 3C:
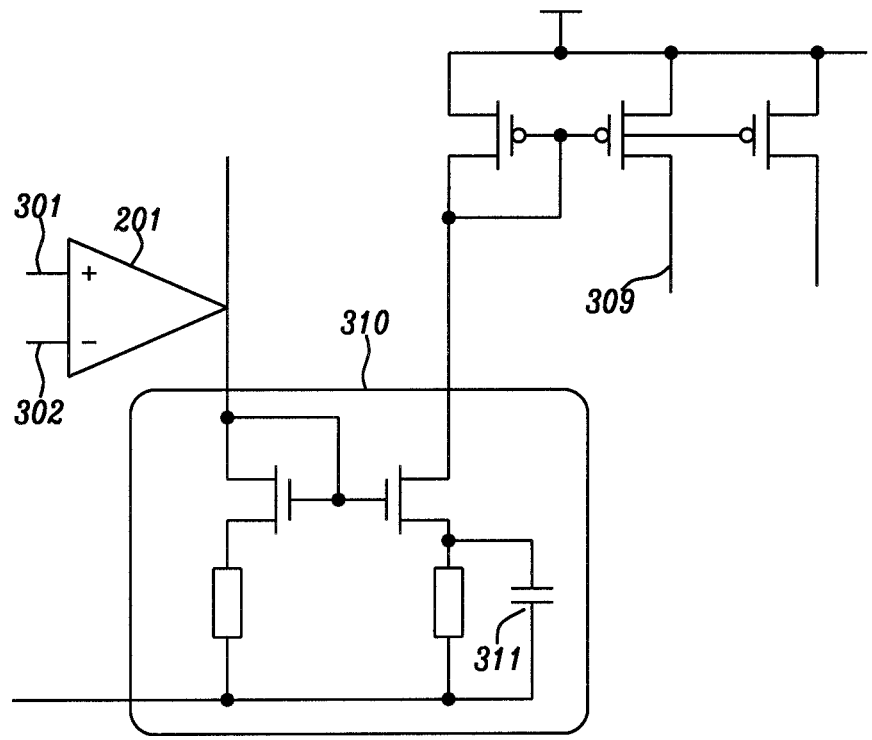

FIG. 3B illustrates an example of a single ended equalizing amplifier 210 which comprises an equalization stage 310 for one input 302 of the amplifier 210. The other input transistor may be coupled to a fixed voltage level. FIG. 3C illustrates the use of an equalization stage 310 at the output of the GM-stage 201.

Figure 3D:
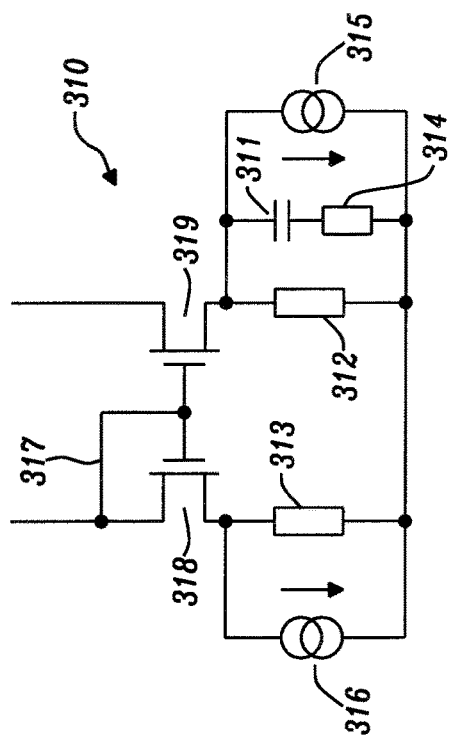
FIG. 3D shows a circuit diagram of an example current mode amplifier or equalization stage.

FIG. 3D illustrates an equalization stage 310 in further detail. The equalization stage 310 comprises a current mirror 317 and/or stage transistors 318, 319. The currents through both sides of the current mirror 317, i.e. through both stage transistors 318, 319, flow through different resistor/capacitor networks. In particular, the current on a first side may flow through a resistor 313, wherein the current on the second side may flow through a resistor 312 which is arranged in parallel to the serial arrangement of a capacitor 311 and an optional resistor 314. Furthermore, current sources 316, 315 may be provided at both sides to perform a DC offset.

In other words, FIG. 3D shows a generalized CMFF amplifier 310 which may be used as an equalization stage and which comprises DC current sources 316, 315 which allow changing the DC-to-signal ratio of the amplifier 310. As a result of this, the resistors 313, 312 may be varied within an increased range. Furthermore, the DC current sources 315, 316 may be used to decrease sensitivity with regards to signal current ranges. Furthermore, the DC current sources 315, 316 may be used to shift the desired zero position over an increased range of frequencies.

By adjusting one or more of the components of the equalization stage 310, the position of the zero (for compensating the power of the PDN 120) may be varied over a relatively wide range of frequencies.

Figure 4:
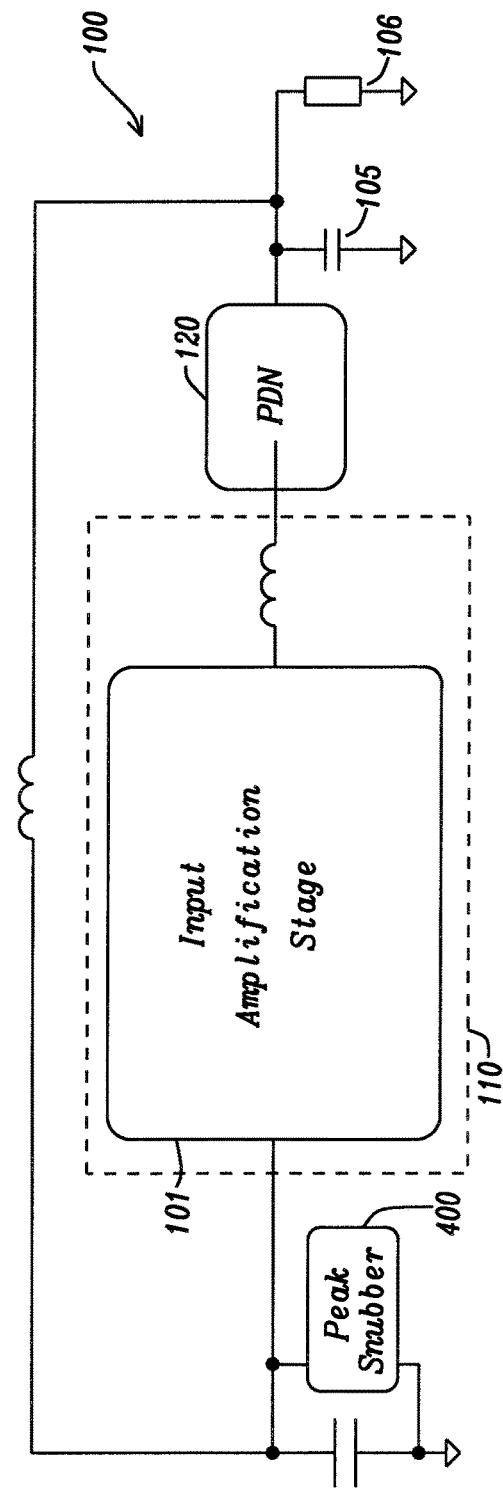
FIG. 4 shows an example power supply with a peak snubber.

The feedback loop may exhibit an LC behavior. Damping may be used to avoid potential stability issues by gain peaking. FIG. 4 shows the use of a peak snubber 400 between the output of the feedback loop and the input of the input amplifier 101 to damp the resonance peak.

Hence, a (regulated) power supply 100 configured to provide power to a load 106 via a power delivery network 120 is described. The power supply 100 may comprise or may be a voltage regulator and/or a power converter. The power delivery network 120 may be configured to add a pole and/or a zero to a transfer function of the power supply 100 (notably a pole). The power delivery network 120 may e.g. comprise an electrical conduction path between the output of the power supply 100 (notably the output of a power converter 110 of the power supply 100) and the load 106. The pole and/or zero which is generated by the PDN 120 may be located at a PDN pole and/or zero frequency, wherein the PDN pole and/or zero frequency may be at 1 MHz or above.

The power supply 100 comprises a feedback unit 104 which is configured to sense the load voltage at the load 106 (e.g. using a voltage divider 104). Furthermore, the feedback unit 104 may be configured to provide a feedback voltage 107 which is indicative of the load voltage to an input of the power supply 100, notably to an input of an input amplifier 101, 201, 210 of the power supply 100. The feedback voltage 107 may be provided via a conduction path. A resonance on the conduction path of the feedback unit 104 may be compensated using a peak snubber 400 at the input of the input amplifier 101, 201, 210 of the power supply 100.

Furthermore, the power supply 100 comprises an input amplifier 101, 201, 210 which is configured to provide an error voltage based on the feedback voltage 107 and possibly based on a reference voltage 108. In a preferred example, the input amplifier 101, 201, 210 comprises a GM-stage 201.

In addition, the power supply 100 comprises a power converter 110 which is configured to provide power to the power delivery network 120 in dependence of the error voltage. The power converter 110 may comprise a switched power converter, notably a buck converter. A duty cycle of a power switch of the power converter 110 may be set in dependence of the error voltage, in order to regulate the load voltage to a target voltage, wherein the target voltage may be indicated by the reference voltage 108 which is applied to the input of the input amplifier 101, 201, 210. As a result of this, power at a stable load voltage may be provided to a load 106.

Furthermore, the power supply 100 typically comprises the power delivery network 120 which is configured to transfer the power provided by the power converter 110 to the load 106. The power which is provided by the power converter 110 may be drawn from a master power supply (e.g. from the battery of a battery powered application, which is comprising the power supply 100).

In addition, the power supply 100 comprises an equalization unit 200, 310 which is configured to add a zero and/or a pole to the transfer function of the power supply 100, such that the pole and/or zero of the power delivery network 120 is at least partially compensated. For this purpose, the equalization unit 200, 310 may be designed and/or dimensioned in dependence of characteristics of the pole and/or zero of the power delivery network 120, notably based on the frequency of the pole and/or zero of the power delivery network 120. The equalization unit 200, 310 may be located at the input of the input amplifier 101, 201, 210 and/or at the input of the power converter 110 and/or somewhere in between the input of the input amplifier 101, 201, 210 and the input of the power converter 110.

Hence a power supply 100 may be provided which allows the load voltage of a load 106 to be regulated in a stable manner (using point-of-load control). Furthermore, one or more poles and/or zeros of the power delivery network 120 may be compensated, thereby allowing for a stable operation of the power supply 100, even for relatively high frequencies. Furthermore, the size of a load capacitor 105 at the load 106 and/or of an output capacitor 202 at the output of the power converter 110 may be reduced, thereby reducing the cost and the size of the power supply 100. In particular, the power supply 100 may not comprise any output capacitor 202 at the output of the power converter 110.

A stable operation of the power supply 100 without equalization unit 200, 310 may require the use of a pre-determined capacitance at the output of the power converter 110 and/or at the load 106 (i.e. at the input and/or the output of the PDN 120). The equalization unit 200, 310 may be configured such that a stable operation (over the same or an extended frequency range) may be achieved using a capacitance at the output of the power converter 110 and/or at the load 106 (i.e. at the input and/or the output of the PDN 120) which is lower than the pre-determined capacitance, e.g. by 20%, 30%, 50% or more.

The equalization unit 200, 310 may be part of the input amplifier 101, 201, 210, thereby providing an equalizing amplifier 210 which can be implemented in a cost efficient manner.

The equalization unit 200, 310 may comprise a current mode (feed forward) amplifier, thereby enabling a cost efficient implementation of an equalization unit 200, 310.

The input amplifier 101, 201, 210 may comprise a first input port 301 to which the feedback voltage 107 is applied, and a first input transistor 321 which is controlled via the first input port 301. The first input transistor 321 may be a MOS (metaloxide semiconductor) transistor.

Furthermore, the input amplifier 101, 201, 210 may comprise a current source 323 which is configured to provide a first current through the first input transistor 321. In addition, the input amplifier 101, 201, 210 may comprise a first current mirror 306 which is configured to mirror the first current to the output 309 of the input amplifier 101, 201, 210 to provide the error voltage. Hence, the input amplifier 101, 201, 210 may comprise a single ended or symmetrical/differential GM-stage.

Furthermore, the input amplifier 101, 201, 210 may comprise a second input port 302 to which the reference voltage 108 is applied. In addition, the input amplifier 101, 201, 210 may comprise a second input transistor 322 (e.g. a MOS transistor) which is controlled via the second input port 302, wherein the current source 323 is configured to provide a second current through the second input transistor 322. Furthermore, the input amplifier 101, 201, 210 may comprise a second current mirror 305 which is configured to mirror the second current to the output 309 of the input amplifier 101, 201, 210 to provide the error voltage. Hence, the input amplifier 101, 201, 210 may comprise a symmetrical or differential GM-stage.

The equalization unit 200, 310 may comprise a current mode amplifier 310 which is arranged between the output of the first current mirror 306 and the output 309 of the input amplifier 101, 201, 210 (wherein the input of the first current mirror 306 is (directly) coupled to the first input transistor 321). Furthermore, the equalization unit 200, 310 may comprise a current mode amplifier 310 which is arranged between the output of the second current mirror 305 and the output 309 of the input amplifier 101, 201, 210 (wherein the input of the second current mirror 305 is (directly) coupled to the second input transistor 322). By providing one or more current mode amplifiers 310 within the input amplifier 101, 201, 210, equalization of the pole and/or zero of the PDN 120 may be implemented in a particularly efficient manner.

The input amplifier 101, 201, 210 may comprise a first equalization stage 310 which is arranged between the output of the first current mirror 306 and the output 309 of the input amplifier 101, 201, 210 (wherein the input of first current mirror 306 is (directly) coupled to the first input transistor 321). Furthermore, the input amplifier 101, 201, 210 may comprise a second equalization stage 310 which is arranged between the output of the second current mirror 305 of the input amplifier 101, 201, 210 and the output 309 of the input amplifier 101, 201, 210 (wherein the input of second current mirror 305 is (directly) coupled to the second input transistor 322). By providing one or more equalization stages 310 within the input amplifier 101, 201, 210, equalization of the pole and/or zero of the PDN 120 may be implemented in a particularly efficient manner.

The first equalization stage 310 and the second equalization stage 310 may be designed and/or dimensioned in an identical manner.

The first equalization stage 310 may comprise a first stage transistor 318 (e.g. a MOS transistor) which is arranged in series with the output of the first current mirror 306 of the input amplifier 101, 201, 210. Furthermore, the first equalization stage 310 may comprise a second stage transistor 319 (e.g. a MOS transistor) which is coupled to the output 309 of the input amplifier 101, 201, 210 via a further current mirror. The gates of the first stage transistor 318 and the second stage transistor 319 may be (directly) coupled with one another.

Furthermore, the first equalization stage 310 may comprise a first equalization network 313, 316 arranged in series with the first stage transistor 318. In addition, the first equalization stage 310 may comprise a second equalization network 312, 311, 314, 315 arranged in series with the second stage transistor 319. Far ends of the first equalization network 313, 316 and the second equalization network 312, 311, 314, 315 (which are opposite of the first stage transistor 318 and/or the second stage transistor 319) may be (directly) coupled with one another.

In a corresponding manner, the second equalization stage 310 may comprise a third stage transistor 318 (e.g. a MOS transistor) which is arranged in series with the output of the second current mirror 305 of the input amplifier 101, 201, 210. Furthermore, the second equalization stage 310 may comprise a fourth stage transistor 319 (e.g. a MOS transistor) which is coupled to the output 309 of the input amplifier 101, 201, 210 via a further current mirror. The gates of the third stage transistor 318 and the fourth stage transistor 319 may be (directly) coupled with one another.

Furthermore, the second equalization stage 310 may comprise a third equalization network 313, 316 arranged in series with the third stage transistor 318, as well as a fourth equalization network 312, 311, 314, 315 arranged in series with the fourth stage transistor 319. Far ends of the third equalization network 313, 316 and the fourth equalization network 312, 311, 314, 315 (which are opposite of the third stage transistor 318 and/or the fourth stage transistor 319) may be (directly) coupled with one another.

The first and/or third equalization network 313, 316 and the second and/or fourth equalization network 312, 311, 314, 315 (notably one or more resistors and/or capacitors of the respective networks) may be dimensioned in dependence of the pole and/or zero generated by the power delivery network 120, thereby providing a reliable and precise equalization of the pole and/or zero generated by the power delivery network 120.

The first and/or third equalization network 313, 316 may comprise a first resistor 313. The second and/or fourth equalization network 312, 311, 314, 315 may comprise a second resistor 312 and a capacitor 311, wherein the capacitor 311 may be part of a branch that is arranged in parallel to the second resistor 312. Values of the one or more resistors and/or the one or more capacitors may be selected in dependence of the pole and/or zero generated by the power delivery network 120 to provide a reliable and precise equalization of the pole and/or zero generated by the power delivery network 120.

The first and/or third equalization network 313, 316 may comprise a first current source 316 which is arranged in parallel to the first resistor 313. Furthermore, the second and/or fourth equalization network 312, 311, 314, 315 may comprise a second current source 315 which is arranged in parallel to the second resistor 312. The current sources 315, 316 may be used to extend the frequency range for compensation of the pole and/or zero generated by the power delivery network 120.

The output of the further current mirror which is coupled to the second stage transistor 319 and the output of the further current mirror which is coupled to the fourth stage transistor 319 may be coupled with one another, to form the output 309 of the input amplifier 101, 201, 210, thereby providing a differential output for the input amplifier 101, 201, 210.

Figure 6:
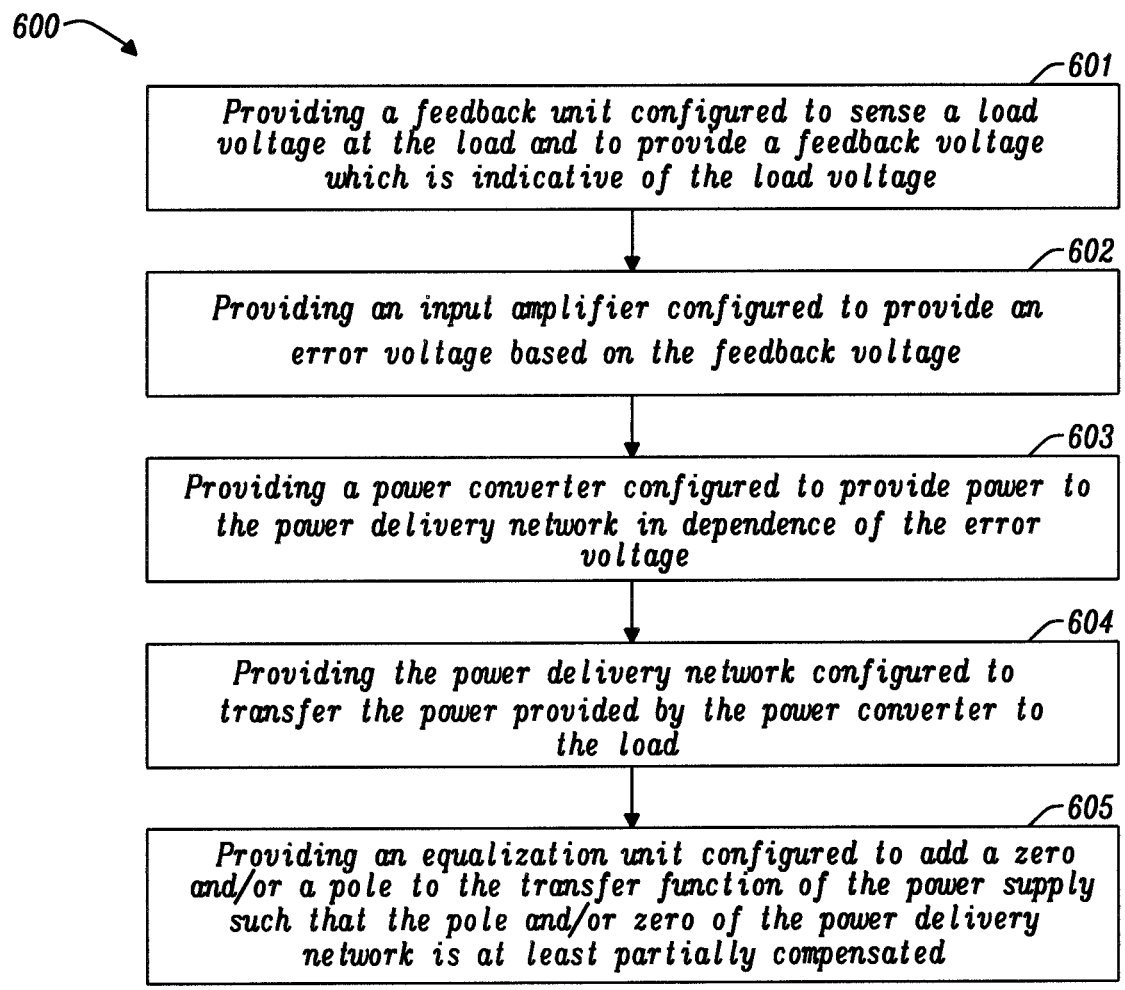
FIG. 6 show a flow chart of an example method for compensating the effects of a power delivery network.

FIG. 6 shows a flow chart of an example method 600 for providing power to a load 106 via a power delivery network 120, wherein the power delivery network 120 is configured to add a pole and/or zero to a transfer function of the power supply 100. The method 600 comprises providing 601 a feedback unit 104 configured to sense a load voltage at the load 106 and to provide a feedback voltage 107 which is indicative of the load voltage. Furthermore, the method 600 comprises providing 602 an input amplifier 101, 201, 210 configured to provide an error voltage based on the feedback voltage 107. In addition, the method 600 comprises providing 603 a power converter 110 configured to provide power to the power delivery network 120 in dependence of the error voltage. The method 600 may further comprise providing 604 the power delivery network 120 configured to transfer the power provided by the power converter 110 to the load 106. In addition, the method 600 comprises providing 605 an equalization unit 200, 310 configured to add a zero and/or a pole to the transfer function of the power supply 100, such that the pole and/or zero of the power delivery network 120 is at least partially compensated.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A power supply configured to provide power to a load via a power delivery network; wherein the power delivery network is configured to add a pole and/or zero to a transfer function of the power supply; wherein the power supply comprises,
    a feedback unit configured to sense a load voltage at the load and to provide a feedback voltage which is indicative of the load voltage;
    an input amplifier configured to provide an error voltage based on the feedback voltage;
    a power converter configured to provide power to the power delivery network in dependence of the error voltage;
    the power delivery network configured to transfer the power provided by the power converter to the load; and
    an equalization unit configured to add a zero and/or a pole to the transfer function of the power supply, such that the pole and/or zero of the power delivery network is at least partially compensated; wherein the equalization unit is located between an input of the input amplifier and an input of the power converter; and wherein the equalization unit comprises a current mode amplifier.

2. The power supply of claim 1, wherein the equalization unit is part of the input amplifier, thereby providing an equalizing amplifier.

3. The power supply of claim 1, wherein the input amplifier comprises
    a first input port to which the feedback voltage is applied;
    a first input transistor which is controlled via the first input port;
    a current source which is configured to provide a first current through the first input transistor; and
    a first current mirror configured to mirror the first current to an output of the input amplifier to provide the error voltage.

4. The power supply of claim 3, wherein the current mode amplifier is arranged between an output of the first current mirror and the output of the input amplifier.

5. The power supply of claim 3, wherein
    the input amplifier comprises a first equalization stage which is arranged between an output of the first current mirror and the output of the input amplifier; and
    the first equalization stage comprises
        a first stage transistor which is arranged in series with the output of the first current mirror of the input amplifier;
        a second stage transistor which is coupled to the output of the input amplifier via a further current mirror; wherein gates of the first stage transistor and the second stage transistor are coupled with one another;
        a first equalization network arranged in series with the first stage transistor; and
        a second equalization network arranged in series with the second stage transistor; wherein far ends of the first equalization network and the second equalization network are coupled with one another.

6. The power supply of claim 5, wherein the first equalization network and the second equalization network are dimensioned in dependence of the pole and/or zero generated by the power delivery network.

7. The power supply of claim 5, wherein
    the first equalization network comprises a first resistor; and
    the second equalization network comprises a second resistor and a capacitor.

8. The power supply of claim 7, wherein the capacitor is part of a branch that is arranged in parallel to the second resistor.

9. The power supply of claim 7, wherein
    the first equalization network comprises a first current source which is arranged in parallel to the first resistor; and
    the second equalization network comprises a second current source which is arranged in parallel to the second resistor.

10. The power supply of claim 3, wherein the input amplifier comprises
    a second input port to which a reference voltage is applied;
    a second input transistor which is controlled via the second input port; wherein the current source is configured to provide a second current through the second input transistor; and
    a second current mirror configured to mirror the second current to the output of the input amplifier to provide the error voltage.

11. The power supply of claim 10, wherein
    the input amplifier comprises a second equalization stage which is arranged between an output of the second current mirror of the input amplifier and the output of the input amplifier; and
    the second equalization stage comprises
        a third stage transistor which is arranged in series with the output of the second current mirror of the input amplifier;
        a fourth stage transistor which is coupled to the output of the input amplifier via a further current mirror; wherein gates of the third stage transistor and the fourth stage transistor are coupled with one another;
        a third equalization network arranged in series with the third stage transistor;

a fourth equalization network arranged in series with the fourth stage transistor; wherein far ends of the third equalization network and the fourth equalization network are coupled with one another.

12. The power supply of claim 1, wherein
the feedback unit comprises voltage sensing means, which are configured to sense the load voltage, and a conducting path to provide the sensed load voltage as feedback voltage to an input of the input amplifier; and/or
the power converter comprises a switching power converter; and/or
the power supply comprises a load capacitor at the load and/or an output capacitor at an output of the power converter.

13. A method for providing power to a load via a power delivery network; wherein the power delivery network adds a pole and/or zero to a transfer function of the power supply; wherein the method comprises, providing a feedback unit to sense a load voltage at the load and to provide a feedback voltage which is indicative of the load voltage;

providing an input amplifier to provide an error voltage based on the feedback voltage;

providing a power converter to provide power to the power delivery network in dependence of the error voltage;

providing the power delivery network to transfer the power provided by the power converter to the load; and providing an equalization unit to add a zero and/or a pole to the transfer function of the power supply, such that the pole and/or zero of the power delivery network is at least partially compensated; wherein the equalization unit is located between an input of the input amplifier and an input of the power converter; and wherein the equalization unit comprises a current mode amplifier.

* * * * *